(12) United States Patent
Chen et al.

(10) Patent No.: US 12,414,435 B2
(45) Date of Patent: Sep. 9, 2025

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Wenbo Chen, Beijing (CN); Linhong Han, Beijing (CN); Youngyik Ko, Beijing (CN); Qingqing Yan, Beijing (CN); Qiwei Wang, Beijing (CN); Hong Yi, Beijing (CN); Yuanjie Xu, Beijing (CN); Zhongliu Yang, Beijing (CN); Benlian Wang, Beijing (CN); Ziyang Yu, Beijing (CN); Lili Du, Beijing (CN); Haigang Qing, Beijing (CN); Weiyun Huang, Beijing (CN)

(73) Assignees: Chengdu BOE Optoelectronics Technology Co., Ltd., Chengdu (CN); BOE TECHNOLOGY GROUP., LTD., Beijing (CN)

( * ) Notice: Subject to any disclaimer, the term of this patent is extended or adjusted under 35 U.S.C. 154(b) by 129 days.

(21) Appl. No.: 17/790,156

(22) PCT Filed: Apr. 30, 2021

(86) PCT No.: PCT/CN2021/091654
§ 371 (c)(1),
(2) Date: Jun. 30, 2022

(87) PCT Pub. No.: WO2022/227058
PCT Pub. Date: Nov. 3, 2022

(65) Prior Publication Data
US 2024/0107830 A1 Mar. 28, 2024

(51) Int. Cl.
*H10K 59/121* (2023.01)
*H10K 59/131* (2023.01)
*H10K 59/88* (2023.01)

(52) U.S. Cl.
CPC ......... *H10K 59/121* (2023.02); *H10K 59/131* (2023.02); *H10K 59/88* (2023.02)

(58) Field of Classification Search
None
See application file for complete search history.

(56) References Cited

U.S. PATENT DOCUMENTS 9,304,537 B2   4/2016  Wu
9,991,324 B2   6/2018  Li et al.
(Continued)

FOREIGN PATENT DOCUMENTS

CN   102903732 A   1/2013
CN   105047686 A   11/2015
(Continued)

OTHER PUBLICATIONS

International Search Report of PCT/CN2021/091654 dated Feb. 7, 2022 with English translation.
(Continued)

*Primary Examiner* — Michelle Mandala
(74) *Attorney, Agent, or Firm* — Collard & Roe, P.C.

(57) ABSTRACT

A display substrate and a display device are provided. The display substrate includes a base substrate, at least one group of contact pads, a plurality of first light-emitting elements, a plurality of first pixel driving circuits, a plurality of connecting traces, a plurality of data lines and a plurality of leads. The display area includes a first display area and a second display area; the first light-emitting elements are located in the first display area; the first pixel driving circuits are located in the second display area; the leads are located
(Continued)

in the first display area and the peripheral area, and connect the data lines and the at least one group of contact pads; orthographic projections of the first light-emitting elements on a substrate surface of the base substrate are at least partly overlapped with orthographic projections of the leads on the substrate surface of the base substrate.

20 Claims, 10 Drawing Sheets

(56) References Cited

U.S. PATENT DOCUMENTS

| | | | |
|---|---|---|---|
| 10,373,986 | B2 | 8/2019 | Lai et al. |
| 10,928,696 | B2* | 2/2021 | Kuroe .................. G09G 3/3677 |
| 11,417,270 | B2 | 8/2022 | Bian |
| 11,435,792 | B2 | 9/2022 | Hu et al. |
| 2014/0117320 | A1 | 5/2014 | Jung |
| 2018/0108310 | A1* | 4/2018 | Dong .................... G06F 3/0412 |
| 2019/0140025 | A1* | 5/2019 | Wang .................... H05K 1/028 |
| 2020/0185467 | A1 | 6/2020 | Sun et al. |
| 2021/0191482 | A1 | 6/2021 | Zhou |
| 2022/0093540 | A1 | 3/2022 | Zhang et al. |
| 2022/0199028 | A1* | 6/2022 | Wang .................... H10K 59/131 |
| 2022/0366848 | A1* | 11/2022 | Huang ................. G09G 3/3266 |

FOREIGN PATENT DOCUMENTS

| | | |
|---|---|---|
| CN | 107561799 A | 1/2018 |
| CN | 107919090 A | 4/2018 |
| CN | 110224078 A | 9/2019 |
| CN | 110706638 A | 1/2020 |
| CN | 110942746 A | 3/2020 |
| CN | 111025793 A | 4/2020 |
| CN | 212516405 U | 2/2021 |
| IN | 110491915 A | 11/2019 |

OTHER PUBLICATIONS

Written Opinion of PCT/CN2021/091654 dated Feb. 7, 2022 in Chinese.

* cited by examiner

DISPLAY SUBSTRATE AND DISPLAY DEVICE

CROSS REFERENCE TO RELATED APPLICATIONS

This application is the National Stage of PCT/CN2021/091654 filed on Apr. 30, 2021, the disclosure of which is incorporated by reference.

TECHNICAL FIELD

Embodiments of the present disclosure relate to a display substrate and a display device.

BACKGROUND

For OLED (Organic Light-Emitting Diode) display products, there are many types of circuit units, and each of these circuits plays its own role in displaying. At present, the display products are developing in the direction that a bezel around a display area is continuously narrowed. Especially, a lower bezel of the display area occupies a larger space due to a fan-out area (for example, a lead for connecting a circuit of the display area).

SUMMARY

At least one embodiment of the present disclosure provides a display substrate. The display substrate includes: a base substrate, including a display area and a peripheral area located at least at one side of the display area, the display area including a first display area and a second display area, and the first display area being located between the second display area and the peripheral area in a first direction; at least one group of contact pads located in the peripheral area; a plurality of first light-emitting elements located in the first display area; a plurality of first pixel driving circuits located in the second display area; a plurality of connecting traces, one end of at least one connecting trace of the plurality of connecting traces being electrically connected with at least one first light-emitting element of the plurality of first light-emitting elements, and the other end of the at least one connecting trace being electrically connected with the first pixel driving circuit; a plurality of data lines located in the second display area and configured to provide data signals to the plurality of first pixel driving circuits; and a plurality of leads located in the first display area and in the peripheral area, the plurality of leads connecting the plurality of data lines and the at least one group of contact pads; wherein orthographic projections of the plurality of first light-emitting elements on a substrate surface of the base substrate are at least partly overlapped with orthographic projections of the plurality of leads on the substrate surface of the base substrate.

For example, in the display substrate provided by at least one embodiment of the present disclosure, the orthographic projections of at least some first light-emitting elements of the plurality of first light-emitting elements on the substrate surface of the base substrate have no overlap with orthographic projections of the plurality of first pixel driving circuits and the plurality of data lines on the substrate surface of the base substrate.

For example, the display substrate provided by at least one embodiment of the present disclosure further includes a plurality of second pixel driving circuits and a plurality of second light-emitting elements; wherein the plurality of second pixel driving circuits and the plurality of second light-emitting elements are located in the second display area, and the plurality of second pixel driving circuits are configured to drive the plurality of second light-emitting elements to emit light; the plurality of second pixel driving circuits are electrically connected with the plurality of data lines, and the plurality of data lines are configured to provide data signals to the plurality of second pixel driving circuits; and orthographic projections of the plurality of second light-emitting elements on the substrate surface of the base substrate are at least partly overlapped with orthographic projections of the plurality of second pixel driving circuits on the substrate surface of the base substrate.

For example, in the display substrate provided by at least one embodiment of the present disclosure, the plurality of second pixel driving circuits include a plurality of second pixel circuit groups arranged along the first direction and extending along a second direction, the first direction intersects with the second direction, and each of the plurality of second pixel circuit groups includes a plurality of rows of second pixel driving circuits extending along the second direction; the plurality of first pixel driving circuits include a plurality of first pixel circuit groups arranged along the first direction and extending along the second direction, and each of the plurality of first pixel circuit groups includes a plurality of rows of first pixel driving circuits extending along the second direction; and the plurality of rows of second pixel driving circuits are located at a side of the plurality of rows of first pixel driving circuits away from the first display area.

For example, the display substrate provided by at least one embodiment of the present disclosure further includes at least one row of first dummy pixel driving circuits extending along the second direction; in the first direction, the at least one row of first dummy pixel driving circuits are distributed at intervals between the at least one row of second pixel driving circuits extending along the second direction.

For example, in the display substrate provided by at least one embodiment of the present disclosure, in the first direction, the first dummy pixel driving circuit is not provided between a plurality of rows of first pixel driving circuits extending in the second direction.

For example, in the display substrate provided by at least one embodiment of the present disclosure, in the first direction, two adjacent rows of first dummy pixel driving circuits extending in the second direction are spaced apart by at least one second pixel circuit group.

For example, in the display substrate provided by at least one embodiment of the present disclosure, a size of the second pixel driving circuit in the first direction is larger than that of the first pixel driving circuit in the first direction.

For example, in the display substrate provided by at least one embodiment of the present disclosure, the size of the second pixel driving circuit in the first direction is in the range from 63 microns to 65 microns, and the size of the first pixel driving circuit in the first direction is in the range from 60 microns to 62 microns.

For example, in the display substrate provided by at least one embodiment of the present disclosure, a size of the first pixel driving circuit and a size of the second pixel driving circuit are equal in the first direction.

For example, in the display substrate provided by at least one embodiment of the present disclosure, the size of the first pixel driving circuit and the size of the second pixel driving circuit are equal in the first direction, and have a value in the range from 63.8 microns to 63.9 microns.

For example, in the display substrate provided by at least one embodiment of the present disclosure, the plurality of connecting traces include a first connecting trace partially located in the first display area and a second connecting trace located in the second display area; wherein the second connecting trace is electrically connected with a corresponding second light-emitting element, the first connecting trace is electrically connected with a corresponding first light-emitting element, and the corresponding second light-emitting element electrically connected with the second connecting trace and the corresponding first light-emitting element electrically connected with the first connecting trace emit light with the same color; and a line width of the second connecting trace is larger than that of the first connecting trace.

For example, the display substrate provided by at least one embodiment of the present disclosure further includes a first metal layer, a second metal layer and a third metal layer, wherein the first metal layer is located on the base substrate, the second metal layer is located at a side of the first metal layer away from the base substrate, and the third metal layer is located at a side of the second metal layer away from the base substrate; the plurality of leads are arranged in the same layer as the first metal layer or the second metal layer; or some leads of the plurality of leads are arranged in the same layer as the first metal layer, and the other leads of the plurality of leads are arranged in the same layer as the second metal layer; and the some leads and the other leads are alternately arranged.

For example, in the display substrate provided by at least one embodiment of the present disclosure, the peripheral area further includes a bending area which is located at a side of the first display area away from the second display area, and the bending area includes a plurality of signal lines, the plurality of signal lines extend along the first direction and are connected in one-to-one correspondence with the plurality of leads; wherein the first direction intersects with the second direction.

For example, in the display substrate provided by at least one embodiment of the present disclosure, the plurality of leads include a plurality of first leads and a plurality of second leads, the plurality of first leads are connected in one-to-one correspondence with the plurality of second leads, the plurality of first leads are located in the first display area, and the plurality of second leads are located in the peripheral area and are connected in one-to-one correspondence with the plurality of signal lines.

For example, in the display substrate provided by at least one embodiment of the present disclosure, the plurality of data lines have a first average line spacing in the second direction, the plurality of signal lines have a second average line spacing in the second direction, and the plurality of first leads have a third average line spacing in the second direction; wherein the third average line spacing is between the first average line spacing and the second average line spacing.

For example, in the display substrate provided by at least one embodiment of the present disclosure, the third average line spacing of the plurality of first leads is decreased, in the first direction, from a side close to the plurality of data lines to another side away from the plurality of data lines.

At least one embodiment of the present disclosure provides a display device, including the display substrate described in any of the above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left"

and the like are only used to indicate relative position relationship, and when the position of the object which is described is changed, the relative position relationship may be changed accordingly.

Figure 1:
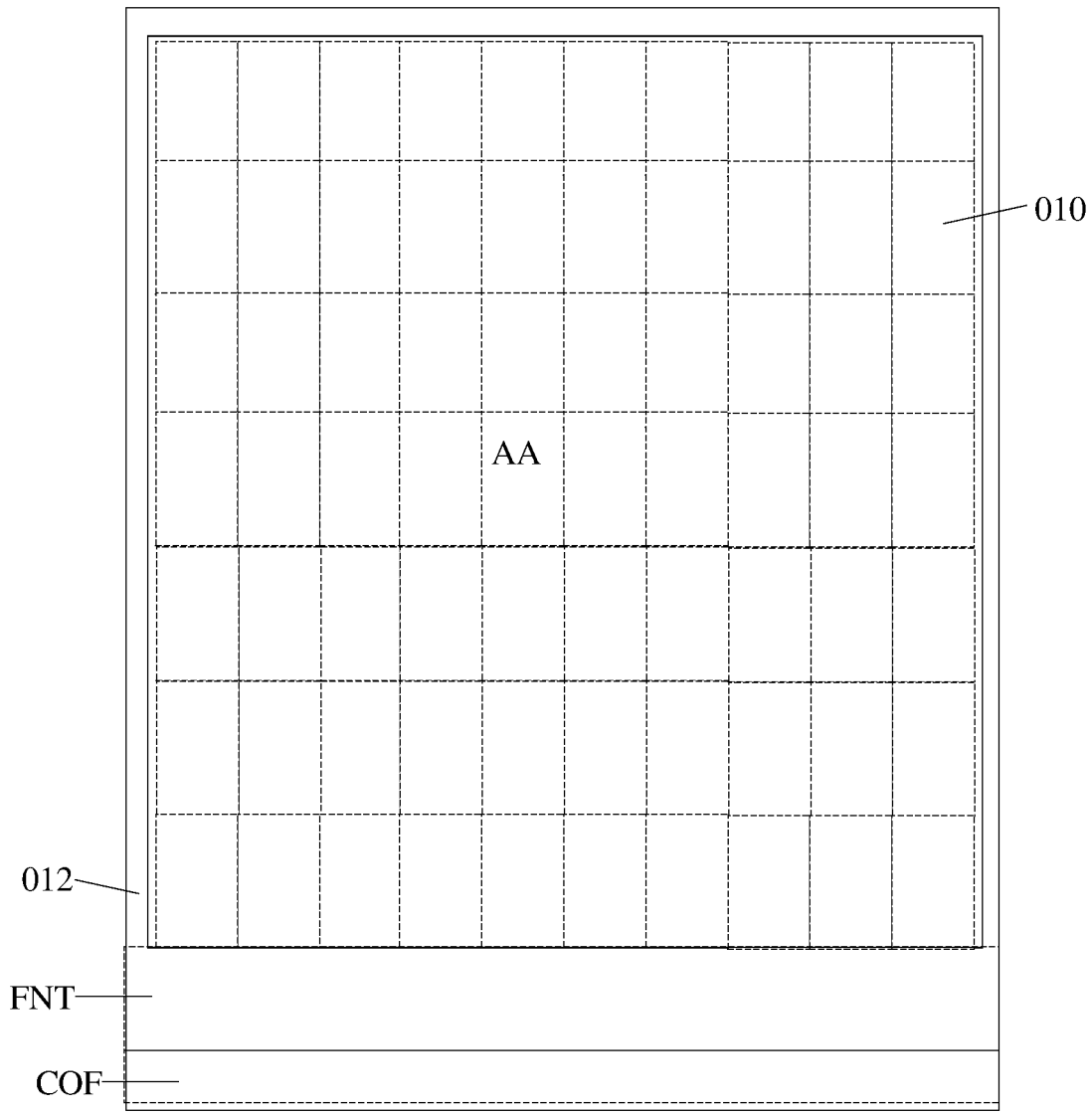
FIG. 1 is a schematic diagram of a display substrate.

FIG. 1 is a schematic diagram of a display substrate.

For example, as shown in FIG. 1, the display substrate 01 includes a display area AA and a peripheral area 012 surrounding the display area AA. The peripheral area 012 includes a lower bezel located at one side of the display area AA. The lower bezel includes a fan-out area FNT and a bonding area COF. The fan-out area FNT is located between the display area AA and the bonding area COF. The bonding area COF is configured to be bonded with a signal input element, for example, the signal input element includes an integrated circuit (IC), and for another example, the signal input element includes a data driving circuit IC. The fan-out area FNT includes a plurality of traces electrically connected with signal lines located in the display area AA, and the plurality of traces are also electrically connected with signal input elements of the bonding area COF. The display area AA includes a plurality of sub-pixels arranged in an array and configured to display an image. Because the fan-out area takes up a larger space, the lower bezel of the display substrate 01 is difficult to be narrowed.

For example, as shown in FIG. 1, the display substrate 01 includes a plurality of pixel driving circuits 010 arranged in an array. The display area AA may include a plurality of light-emitting elements (not shown in the figure) arranged in an array. The plurality of light-emitting elements are electrically connected with the plurality of pixel driving circuits 010, for example, in one-to-one correspondence, and a periodic size of the pixel driving circuits 010 is as same as that of the light-emitting elements, under general conditions. At present, it is difficult to narrow the lower bezel of the display substrate 01.

At least one embodiment of the present disclosure provides a display substrate, which includes a base substrate, at least one group of contact pads, a plurality of first light-emitting elements, a plurality of first pixel driving circuits, a plurality of connecting traces, a plurality of data lines and a plurality of leads. The base substrate includes a display area and a peripheral area located at least at one side of the display area; the display area includes a first display area and a second display area, and the first display area is located between the second display area and the peripheral area in a first direction; the at least one group of contact pads is located in the peripheral area; the plurality of first light-emitting elements are located in the first display area; the plurality of first pixel driving circuits are located in the second display area; one end of at least one connecting trace among the plurality of connecting traces is electrically connected with at least one first light-emitting element, and the other end of the at least one connecting trace is electrically connected with the first pixel driving circuit; the plurality of data lines are located in the second display area and configured to provide data signals to the plurality of first pixel driving circuits; the plurality of leads are located in the first display area and in the peripheral area, and connect the plurality of data lines and the at least one group of contact pads; orthographic projections of the plurality of first light-emitting elements on a substrate surface of the base substrate are at least partially overlapped with orthographic projections of the plurality of leads on the substrate surface of the base substrate.

At least one embodiment of the present disclosure also provides a display device including the display substrate described above.

In the display substrate and display device provided by the above embodiments, the orthographic projections of the plurality of first light-emitting elements on the substrate surface of the base substrate are at least partly overlapped with the orthographic projections of the plurality of leads on the substrate surface of the base substrate, that is, the plurality of leads are moved upwardly in a direction close to the second display area along the first direction, and at least some of the plurality of leads are overlapped with the first display area, so that at least some of the plurality of leads are arranged at a side of the first light-emitting elements close to the base substrate in a direction perpendicular to the substrate surface of the base substrate, thereby narrowing the lower bezel of the display substrate.

Embodiments and examples of the present disclosure will be described in detail below with reference to the accompanying drawings.

Figure 2:
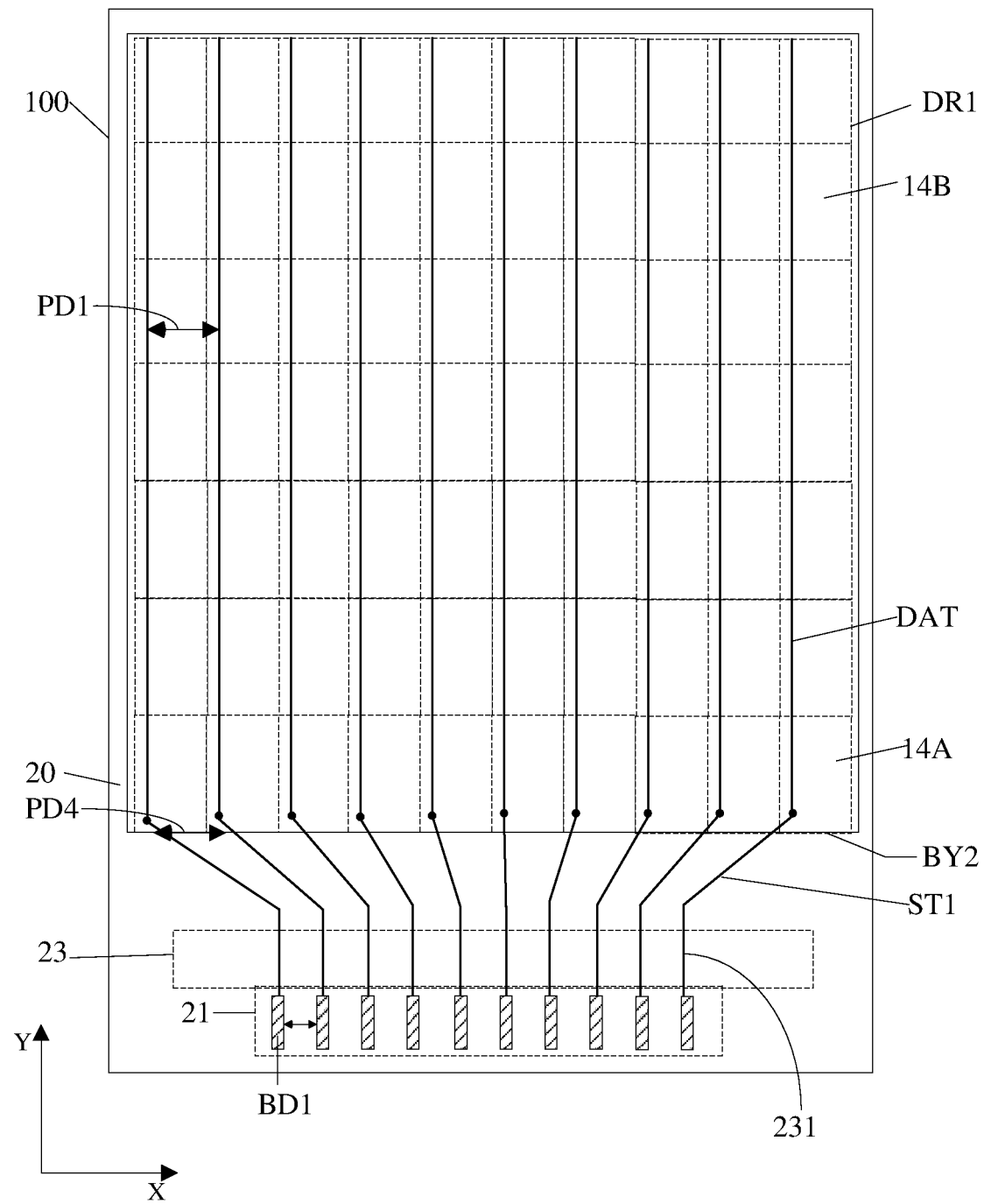
FIG. 2 is a schematic diagram of a display substrate provided by at least one embodiment of the present disclosure.
Figure 3A:
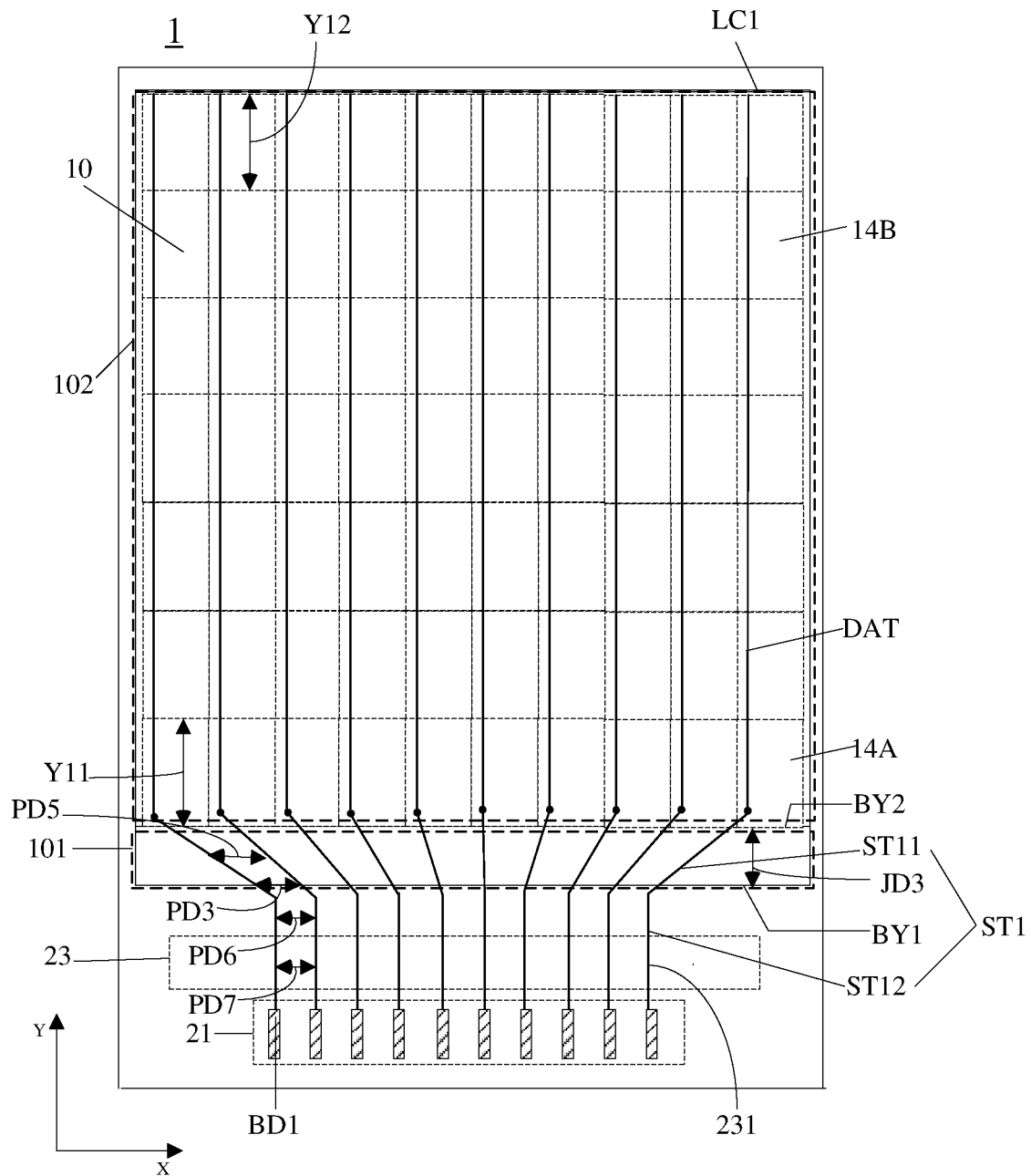
FIG. 3A is a schematic diagram of another display substrate provided by at least one embodiment of the present disclosure.

FIG. 2 is a schematic diagram of a display substrate provided by at least one embodiment of the present disclosure; FIG. 3A is a schematic diagram of another display substrate provided by at least one embodiment of the present disclosure; and FIG. 4 is a partial structural diagram of a first display area of a display substrate provided by at least one embodiment of the present disclosure.

For example, in some embodiments, as shown in FIGS. 2 and 3A, the display substrate 1 includes a base substrate 100. The base substrate 100 includes a display area 10 and a peripheral area 20. The display area 10 is, for example, a gray translucent area as shown in FIG. 3A. The display area 10 includes a first display area 101 and a second display area 102. In the first direction Y (for example, the longitudinal direction in the figure), the first display area 101 is located between the second display area 102 and the peripheral area 20. For example, the peripheral area 20 surrounds the first display area 101 and the second display area 102. The peripheral area 20 may also be located at one side of the first display area 101 or the second display area 102. For example, in the first direction Y, the first display area 101 is closer to the peripheral area 20. For example, in some embodiments, as shown in FIG. 2, the display substrate 1 further includes at least one group of contact pads BD1 located in the peripheral area 20. For example, the peripheral area 20 includes a bonding area 21 in which the at least one group of contact pads BD1 are arranged along the second direction X. The at least one group of contact pads BD1 is configured to be bonded with a signal input element, for example, the signal input element includes an integrated circuit (IC), and for another example, the signal input element includes a data driving circuit IC. For example, in the first direction Y, the first display area 101 is closer to the at least one group of contact pads BD1 than the second display area 102.

Figure 4:
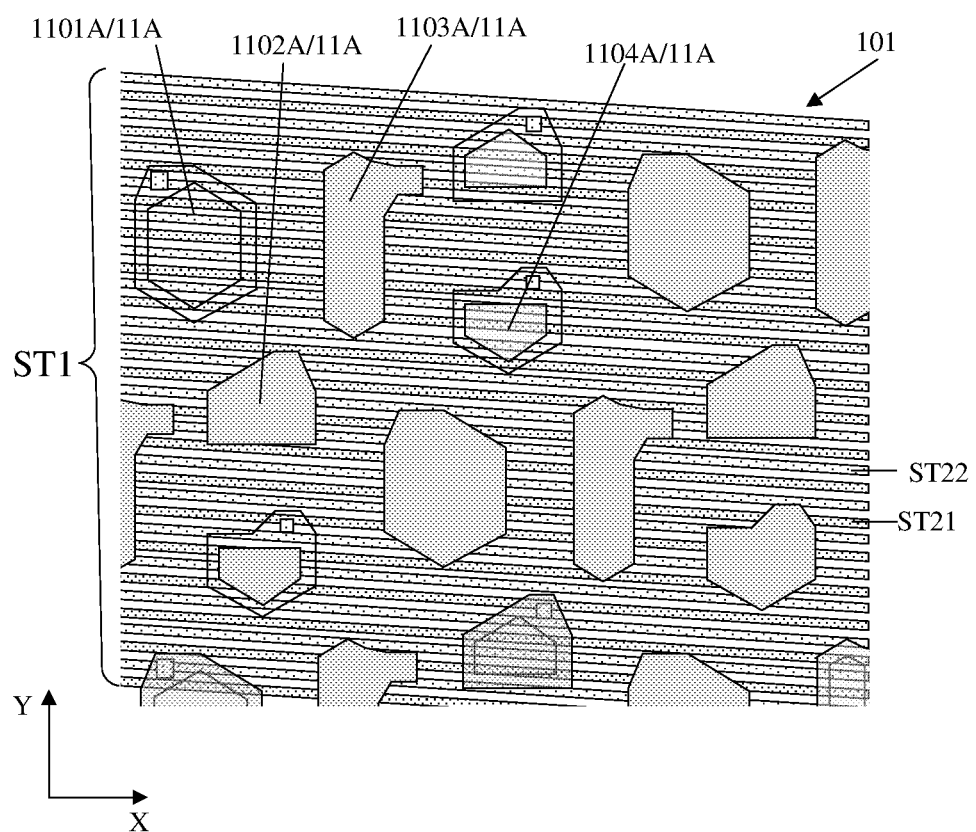
FIG. 4 is a partial structural diagram of a first display area of a display substrate provided by at least one embodiment of the present disclosure.

For example, as shown in FIGS. 3A and 4, the display substrate 1 further includes a plurality of first light-emitting elements 11A (as shown in FIG. 4). The plurality of first light-emitting elements 11A are located in the first display area 101. For example, the display area 10 shown in FIG. 3A includes a plurality of light-emitting elements arranged in an array. Among the plurality of light-emitting elements, the light-emitting elements located in the first display area 101, for example, are referred to as first light-emitting elements 11A. For example, the first light-emitting elements 11A may include a first light-emitting element 1101A emitting blue light, a first light-emitting element 1102A emitting green light, a first light-emitting element 1103A emitting red light and a first light-emitting element 1104A emitting green light. For example, orthographic projections of the first light-emitting elements 11A of the first display area 101 on the substrate surface S of the base substrate 100 (for example, the upper surface of the base substrate 100 shown in FIG. 7) are at least partially overlapped with the plurality of leads ST1 (as shown in FIG. 3A, which will be described in detail later). For example, the orthographic projections of the first light-emitting elements 11A on the substrate surface S of the base substrate 100, as a whole, fall into the first display area 101.

For example, as shown in FIGS. 2 and 3A, the display substrate 1 further includes a plurality of first pixel driving circuits 14A. Orthographic projections of the plurality of first pixel driving circuits 14A on the substrate surface S of the base substrate 100 are located in the second display area 102. The plurality of first pixel driving circuits 14A are electrically connected with the plurality of first light-emitting elements 11A (as shown in FIG. 4), for example, in one-to-one correspondence, and are configured to drive the plurality of first light-emitting elements 11A to emit light, respectively. For example, in FIG. 2 and FIG. 3A, the plurality of rectangular dashed boxes arranged in an array each represent the position of one pixel driving circuit.

It should be noted that, the circuit structure, the wiring layout and the like shown in the drawings of the embodiments of the present disclosure are all schematic, and the embodiments of the present disclosure are not limited thereto.

Figure 5A:
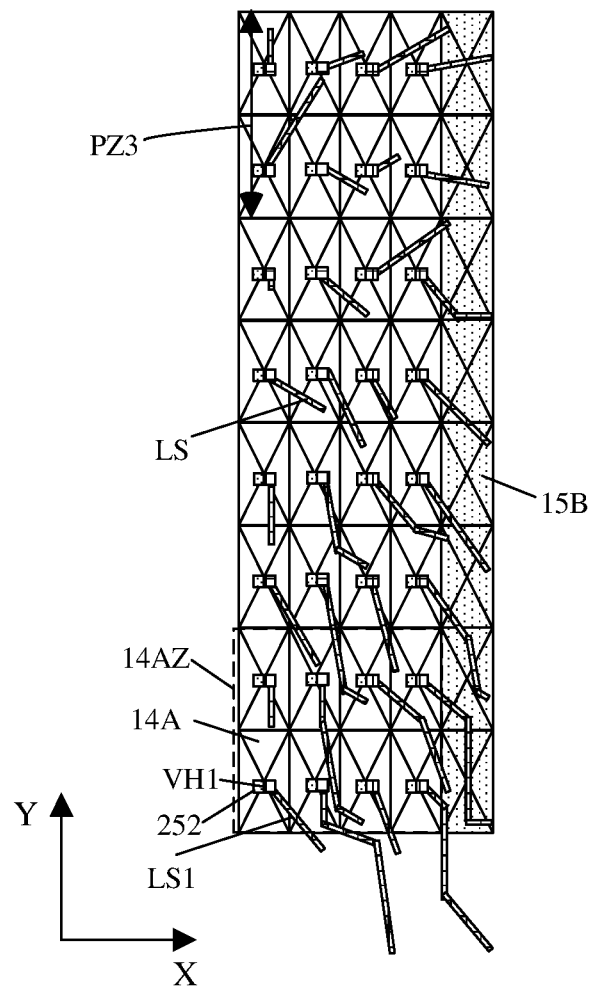
FIG. 5A is a partial structural diagram of a pixel driving circuit of a display substrate provided by at least one embodiment of the present disclosure.
Figure 5B:
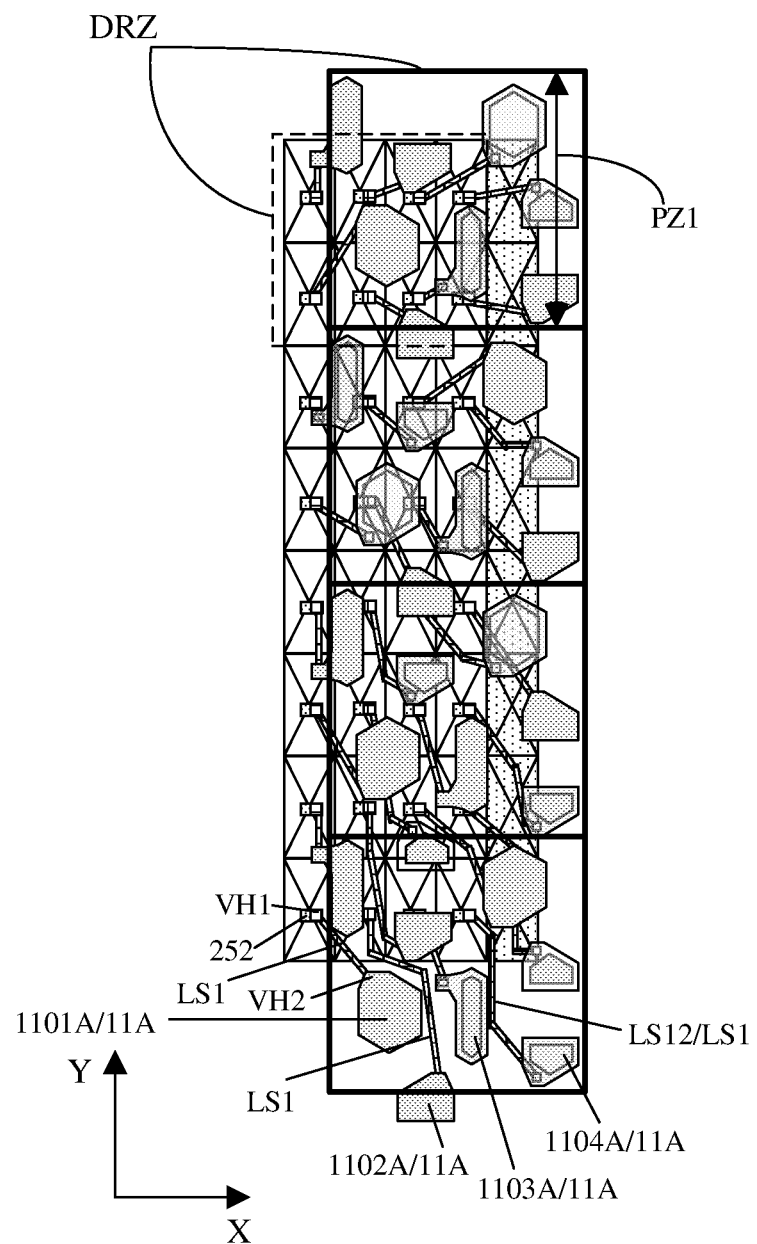
FIG. 5B is a partial structural diagram of a pixel driving circuit and a light-emitting element of a display substrate provided by at least one embodiment of the present disclosure.

FIG. 5A is a partial structural diagram of a pixel driving circuit of a display substrate provided by at least one embodiment of the present disclosure. FIG. 5A is a schematic diagram showing the first pixel driving circuit 14A. FIG. 5B is a partial structural diagram of a pixel driving circuit and a light-emitting element of a display substrate provided by at least one embodiment of the present disclosure. FIG. 5B shows a partial structure of the first display area 101.

For example, as shown in FIG. 5A, the display substrate 1 further includes a plurality of connecting traces LS. Each of the plurality of connecting traces LS is correspondingly connected to one pixel driving circuit. For example, each rectangular box in the figure (there are two intersecting lines in each rectangular box) represents the position of one pixel driving circuit. For example, a plurality of first pixel driving circuits 14A is provided in the lowermost row in FIG. 5A. It should be noted that, the first pixel driving circuits 14A and the first light-emitting elements 11A are arranged, for example, in one to one correspondence.

For example, as shown in FIG. 5A and FIG. 5B, among the plurality of connecting traces LC, one end (the lower end in the figure) of at least one connecting trace LS, such as the connecting trace LS1 in the figure, is electrically connected with at least one first light-emitting element 11A. The other end (the upper end in the figure) of the at least one connecting trace, such as the connecting trace LS1 in the figure, is electrically connected to the first pixel driving circuit 14A. For example, as shown in the figure, the four first pixel driving circuits 14A in the lowermost row are each connected to one of the first light-emitting element 1101A, the first light-emitting element 1102A, the first light-emitting element 1103A and the first light-emitting element 1104A through a connecting trace LS1.

For example, as shown in FIGS. 2 and 3A, the display substrate 1 further includes a plurality of data lines DAT. The plurality of data lines DAT are located in the second display area 102 and extend along the first direction Y. The plurality of data lines DAT are configured to supply data signals to the plurality of first pixel driving circuits 14A. For example, each of the plurality of data lines DAT provides a data signal to one column of pixel driving circuits of the display substrate 1 arranged along the second direction X and extending along the first direction Y.

For example, as shown in FIGS. 2 and 3A, the display substrate 1 further includes a plurality of leads ST1. At least some of the plurality of leads are located in the first display area 101, and are configured to provide data signals to the plurality of first pixel driving circuits 14A. For example, the plurality of leads ST1 are electrically connected to the plurality of data lines DAT in one-to-one correspondence (for example, the leads ST1 are connected to the data lines DAT at the solid dots in the figure), and are also electrically connected to the contact pad BD1 of the bonding area in order to provide the data signals provided by the signal input elements to the first pixel driving circuits. Orthographic projections of at least some of the plurality of leads ST1 on the substrate surface S of the base substrate 100 are overlapped with the first display area 101.

For example, as shown in FIG. 4, the orthographic projection of the first light-emitting element 11A on the substrate surface S of the base substrate 100 is at least partially overlapped with the orthographic projections of the plurality of leads ST1 on the substrate surface S of the base substrate 100. That is, in the direction perpendicular to the substrate surface S of the base substrate 100, the plurality of leads ST1 are routed at the side of the first light-emitting element 11A close to the base substrate 100. According to the embodiment of the present disclosure, the plurality of leads ST1 are moved upwardly towards a direction close to the second display area 102 along the first direction Y, and at least some of the plurality of leads ST1 are overlapped with the first display area 101, so that the at least some of the plurality of leads ST1 are located at the side of the first light-emitting element 11A close to the base substrate 100 in the direction perpendicular to the substrate surface S of the base substrate 100; in this way, the lower bezel of the display substrate 1 is narrowed.

It should be noted that, in the embodiment of the present disclosure, the display area 10 includes a first display area 101 close to the contact pad BD1 in the first direction Y and a second display area 102 away from the contact pad BD1 in the first direction Y.

For example, in the present disclosure, the included angle between the first direction Y and the second direction X is between 70° and 90°, inclusively. For example, the included angle between the first direction Y and the second direction X is 70°, 90° or 80° and the like, which can be set according to actual situations without limited by the embodiment of the present disclosure. For example, the included angle between the first direction Y and the second direction X can also be 75°, 85°, etc.

For example, the base substrate 100 may be a glass substrate, a quartz substrate, a metal substrate, a resin substrate or the like. For example, the material of the base substrate can include organic materials, such as polyimide, polycarbonate, polyacrylate, polyetherimide, polyethersulfone, polyethylene terephthalate, polyethylene naphthalate, and other resin materials; for example, the base substrate 100 can be a flexible substrate or a non-flexible substrate, which are not limited by the embodiments of the present disclosure.

For example, in some embodiments, as shown in FIGS. 3A and 4, the orthographic projections of at least some of the plurality of first light-emitting elements 11A on the substrate surface S of the base substrate 100 have no overlap with the orthographic projections of the plurality of first pixel driving circuits 14A and the plurality of data lines DAT on the substrate surface S of the base substrate 100. For example, in FIG. 4, the orthographic projections of the plurality of first light-emitting elements 11A on the substrate surface S of the base substrate 100 have no overlap with the orthographic projections of the first pixel driving circuit 14A and the data line DAT on the substrate surface S of the base substrate 100. For example, in FIG. 5B, the orthographic projections, on the substrate surface S of the base substrate 100, of the first light-emitting element 1101A, the first light-emitting element 1102A, the first light-emitting element 1103A and the first light-emitting element 1104A located in the lowermost row have no overlap with the orthographic projections of the first pixel driving circuit 14A and the data line DAT on the substrate surface S of the base substrate 100. In this way, the plurality of leads ST1 are moved upwardly in a direction towards the second display area 102 along the first direction Y, and at least some (or all) of the plurality of leads ST1 are overlapped with the first display area 101, so as to facilitate narrowing the lower bezel of the display substrate 1.

For example, in some embodiments, as shown in FIGS. 2 and 3A, the display substrate 1 further includes a plurality of second pixel driving circuits 14B. The plurality of second pixel driving circuits 14B are located at a side of the plurality of first pixel driving circuits 14A away from the contact pad BD1 in the first direction Y.

Figure 6A:
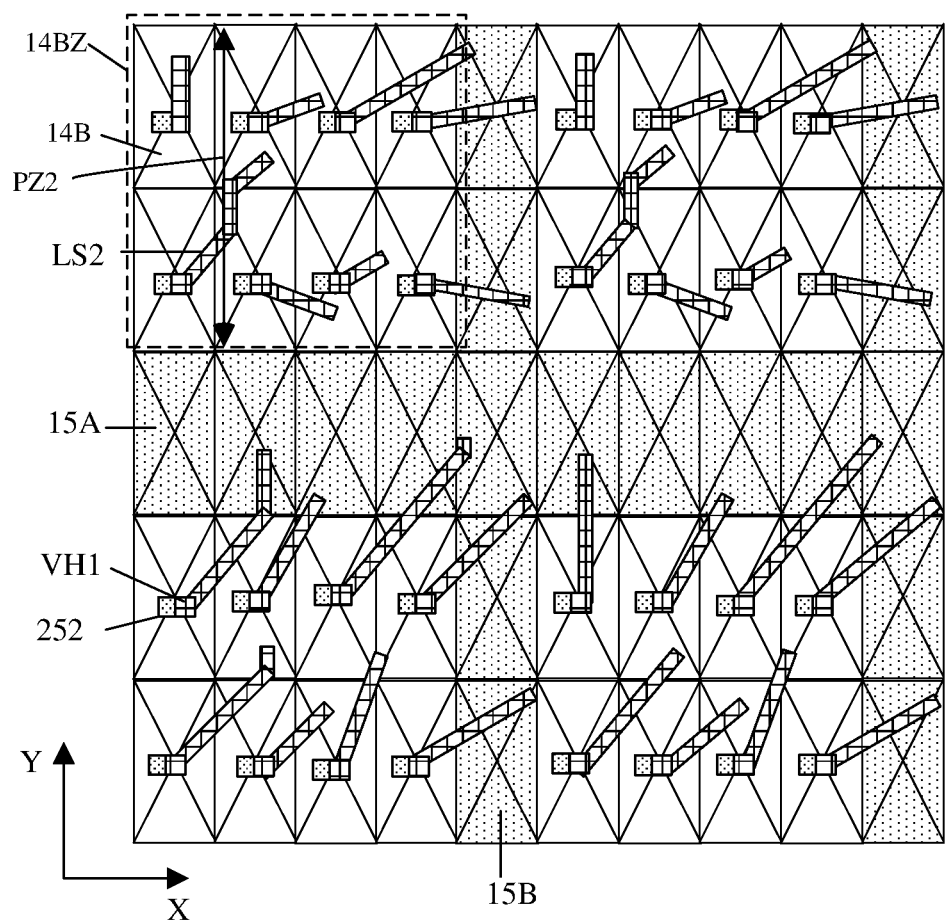
FIG. 6A is another partial structural diagram of a pixel driving circuit of a display substrate provided by at least one embodiment of the present disclosure.
Figure 6B:
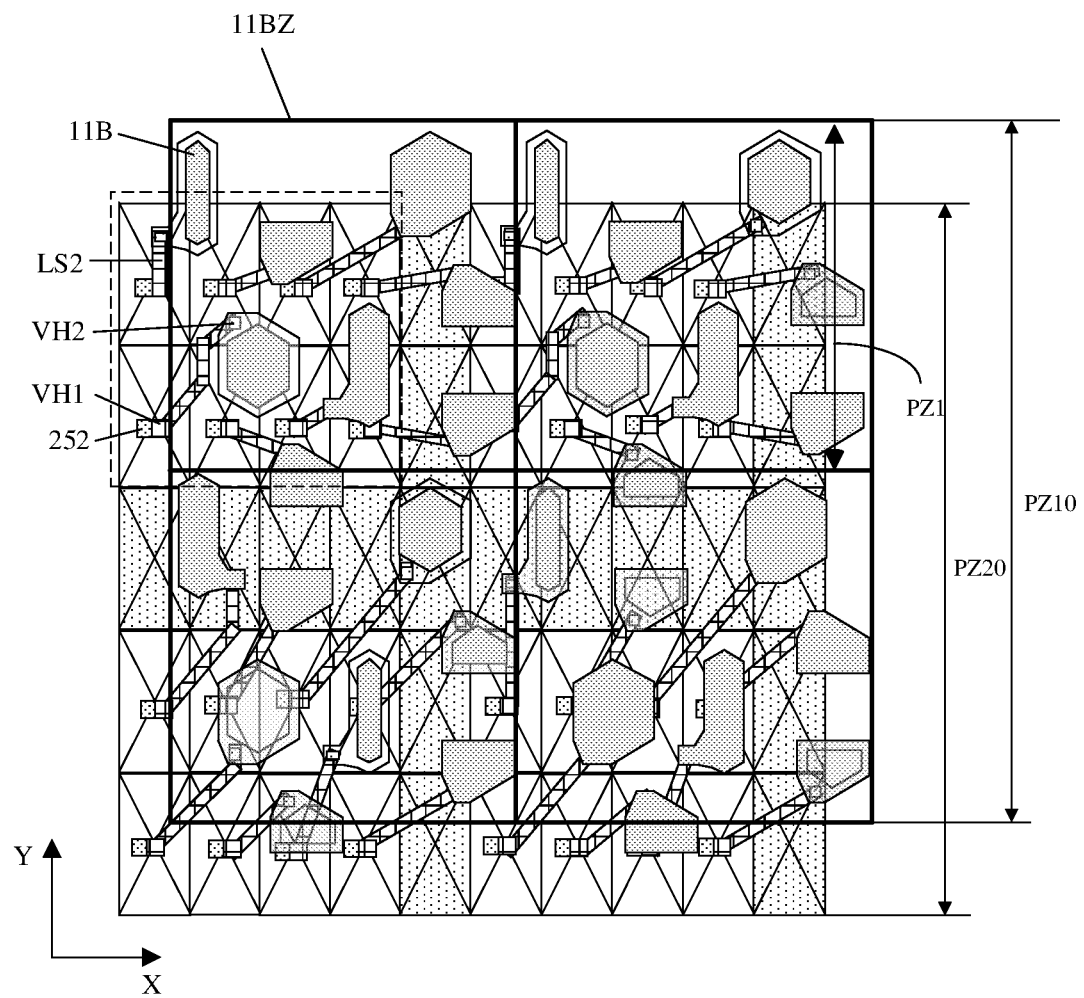
FIG. 6B is another partial structural diagram of a pixel driving circuit and a light-emitting element of a display substrate provided by at least one embodiment of the present disclosure.

FIG. 6A is another partial structural diagram of a pixel driving circuit of a display substrate provided by at least one embodiment of the present disclosure. FIG. 6A shows a schematic diagram of the pixel driving circuit in the second display area. FIG. 6B is another partial structural diagram of a pixel driving circuit and a light-emitting element of a display substrate provided by at least one embodiment of the present disclosure. FIGS. 6A and 6B illustrate a partial structure of the second display area 102.

For example, in some embodiments, as shown in FIGS. 6A and 6B, the display substrate 1 further includes a plurality of second light-emitting elements 11B. The plurality of second pixel driving circuits 14B and the plurality of second light-emitting elements 11B are located in the second display area 102. The plurality of second pixel driving circuits 14B are configured to drive the plurality of second light-emitting elements 11B to emit light. As shown in FIG. 2, the plurality of second pixel driving circuits 14B are electrically connected to a plurality of data lines DAT. For example, the second pixel driving circuits 14B located in the same column are electrically connected to the same data line DAT. The plurality of data lines DAT are configured to provide data signals to the plurality of second pixel driving circuits 14B. Orthographic projections of the plurality of second light-emitting elements 11B on the substrate surface S of the base substrate 100 are at least partly overlapped with orthographic projections of the plurality of second pixel driving circuits 14B on the substrate surface S of the base substrate 100, for example, they are partially overlapped.

It should be noted that in the embodiment of the present disclosure, the orthographic projection of the pixel driving circuit on the substrate surface S of the base substrate 100 is shown in the figures as a rectangular area which represents the area where the pixel driving circuit is located, but the embodiments of the present disclosure are not limited thereto.

For example, in some embodiments, as shown in FIGS. 6A and 6B, the plurality of second pixel driving circuits 14B include a plurality of second pixel circuit groups 14BZ arranged along the first direction Y and extending along the second direction X. Each of the second pixel circuit groups 14BZ includes a plurality of rows of second pixel driving circuits 14B extending along the second direction X. For example, as shown in the figures, the case where each of the second pixel circuit groups 14BZ includes eight second pixel driving circuits 14B arranged in two rows and four columns is described. The plurality of second pixel driving circuits 14B of the second pixel circuit group 14BZ are arranged in four columns along the first direction Y and arranged in two rows along the second direction X.

For example, as shown in FIGS. 5A and 5B, the plurality of first pixel driving circuits 14A include a plurality of first pixel circuit groups 14AZ arranged along the first direction Y and extending along the second direction X. Each of the first pixel circuit groups 14AZ includes a plurality of rows of first pixel driving circuits 14A extending along the second direction X. For example, as shown in the figures, the case where each of the first pixel circuit groups 14AZ includes eight first pixel driving circuits 14A arranged in two rows and four columns is described. The plurality of first pixel driving circuits 14A of the first pixel circuit group 14AZ are arranged in four columns along the first direction Y and arranged in two rows along the second direction X.

For example, as shown in FIG. 2, the plurality of rows of second pixel driving circuits 14B are located at a side of the plurality of rows of first pixel driving circuits 14A away from the contact pad BD1 in the first direction Y. That is, the plurality of rows of second pixel driving circuits 14B are located at a side of the plurality of rows of first pixel driving circuits 14A away from the plurality of leads ST1.

Figure 5C:
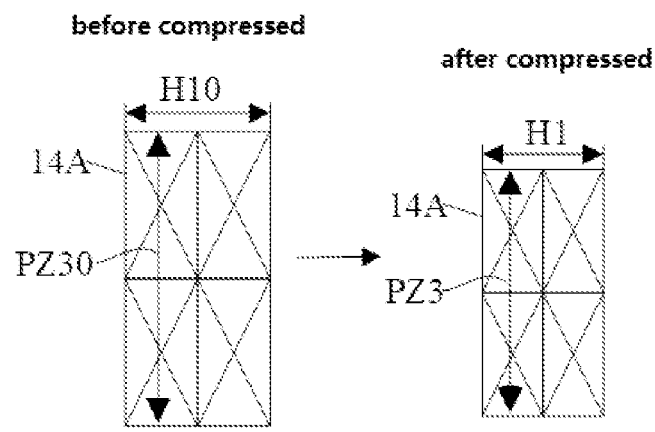
FIG. 5C is a schematic diagram of a pixel circuit group of a display substrate before and after compressed as provided by at least one embodiment of the present disclosure.

FIG. 5C is a schematic diagram of a pixel circuit group of a display substrate before and after compressed as provided by at least one embodiment of the present disclosure.

Figure 3B:
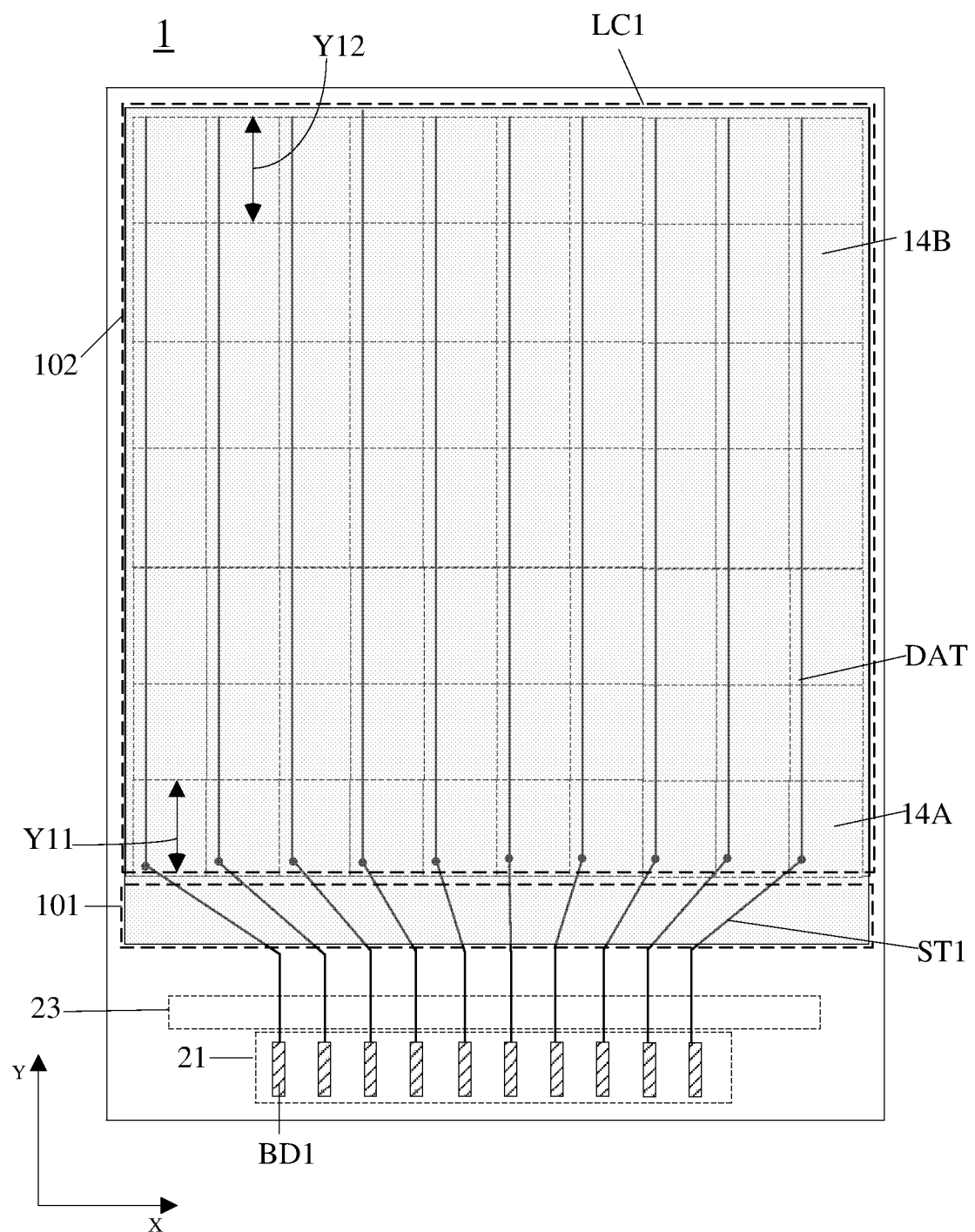
FIG. 3B is a schematic diagram of yet another display substrate provided by at least one embodiment of the present disclosure.

For example, in some embodiments, as shown in FIG. 3B, a size Y11 of the first pixel driving circuit 14A in the first direction Y is as same as a size Y12 of the second pixel driving circuit 14B in the first direction Y. That is, the pixel driving circuits of the display substrate 1 are compressed, as a whole, in the first direction Y. At this time, all the pixel driving circuits still have the same size, which can effectively avoid the risk of abnormal display caused by different driving circuits. As shown in FIG. 5C, taking the second pixel driving circuit 14A as an example. The plurality of second pixel driving circuits 14A are compressed in the first direction Y. For example, the size of two rows of second pixel driving circuits 14A in the first direction Y before compressed is PZ30; the size of two rows of second pixel driving circuits 14A in the first direction Y after compressed is PZ3; and the size PZ3 is smaller than the size PZ30. For example, when the pixel driving circuit is compressed in the first direction Y, it can also be compressed in the second direction X at the same time. For example, the size of two rows of second pixel driving circuits 14A in the second direction X before compressed is H10; the size of two rows of second pixel driving circuits 14A in the second direction X after compressed is H1; and the size H1 is smaller than the size H10. The compression in the second direction X can reduce the length of the connecting trace LS, which is beneficial for the stability of the electrical signals of the light-emitting elements.

For example, in the embodiment of the present disclosure, the pixel driving circuit (for example, the first pixel driving circuit 14A or the second pixel driving circuit 14B) includes conventional 2T1C (i.e., two transistors and one capacitor) pixel circuit, 7T1C (i.e., seven transistors and one capacitor) pixel circuit or the like. The pixel driving circuit 14 includes at least one switching transistor and one first transistor (such as the first transistor 12 in FIG. 7); a gate electrode of the switching transistor receives a gate scanning signal, and a source electrode or a drain electrode of the switching transistor is connected to the data line DAT to receive a data signal. In different embodiments, the pixel driving circuit may further include a compensation circuit, which includes an internal compensation circuit or an external compensation circuit; and the compensation circuit may include transistors, capacitors and the like. For example, the pixel circuit may further include a reset circuit, a light-emitting control circuit, a detection circuit or the like, depending on demands. The embodiment of the present disclosure is not intended to limit the type of the first light-emitting element and the specific structure of the pixel circuit.

For example, in the embodiment of the present disclosure, the compression of the pixel driving circuit can be realized in various ways. For example, by narrowing the gap between the traces in the second direction X or the first direction Y under the condition that the line width or layout of traces of the pixel driving circuit remains unchanged. For example, under the condition that the gap between the traces of the pixel driving circuit remains unchanged, it can reduce the line width or length of the traces. The present disclosure is not intended to limit the compression process of the pixel driving circuit.

It should be noted that, in the embodiment of the present disclosure, the size of each pixel driving circuit is periodic. The first pixel driving circuits 14A electrically connected with the first light-emitting elements 11A in the first display area have the same size, and the second pixel driving circuits 14B electrically connected with the second light-emitting elements 11B in the second display area have the same size.

For example, in some embodiments, as shown in FIG. 3A, the size Y11 of the first pixel driving circuit 14A in the first direction Y is as same as the size Y12 of the second pixel driving circuit 14B in the first direction Y, with a value range of about 63.8-63.9 microns. For example, when the pixel driving circuits of the display substrate 1 are compressed as a whole, reference is made to the case where the size of one pixel driving circuit in the first direction Y before compressed is about 64 microns. In such case, the lower bezel of the display substrate 1 has to be narrowed by an amount of M1. For example, the value of M1 can be set according to the design requirements, for example, about 10-12 microns. For example, if the number of rows of all the pixel driving circuits of the display substrate is N1, the size of each row of pixel driving circuits has to be compressed by an amount which is obtained through dividing M1 by N1. As a result, the value obtained by 64-M1/N1 is the size of the pixel driving circuit in the first direction Y after compressed. It should be noted that, the value ranges of the size Y11 and the size Y12 as mentioned above are illustrated by way of example, and the size of the pixel driving circuit in the longitudinal direction after compressed can be flexibly determined based on the compressed amount of the display substrate and the number of rows of the pixel driving circuits of the display substrate, without particularly limited in the embodiments of the present disclosure.

It should be noted that, the word "about" means that the value can be fluctuated within its range, such as "±5%" or "±25%".

For example, as shown in FIGS. 6A and 6B, the display substrate 1 further includes at least one row of first dummy pixel driving circuits 15A extending along the second direction X. In the first direction Y, each row of the first dummy pixel driving circuits 15A are distributed, at intervals, between the at least one row of second pixel driving circuits 14B extending along the second direction X. For example, the pixel driving circuits of the display substrate 1 are compressed as a whole.

For example, in some embodiments, as shown in FIGS. 6A and 6B, in the first direction Y, adjacent two rows of first dummy pixel driving circuits 15A extending along the second direction X are spaced apart by at least one second pixel circuit group 14BZ there-between. For example, in the first direction Y, one row of first dummy pixel driving circuits 15A is inserted between two second pixel circuit groups 14BZ. For example, as shown in FIG. 6B, in the first direction Y, one row of first dummy pixel driving circuits 15A is inserted between four rows of second pixel driving circuits 14B. In such case, the area in the figure where the plurality of second light-emitting elements 11B corresponding to one second pixel circuit group 14BZ are located is labeled as 11BZ, that is, the rectangular box with bold lines in the figure. The size PZ10 of the area 11BZ in the first direction Y is as same as the size PZ20 of two second pixel circuit groups 14BZ and one row of first dummy pixel driving circuits 15A in the first direction Y. That is, FIG. 6B shows one repeating unit of the second display area 102. The first dummy pixel driving circuit 15A and the second pixel driving circuit 14B have the same circuit design, so as to maintain the uniformity of wirings and improve the display uniformity of the second display area 102. The first dummy pixel driving circuit 15A is not connected to the second light-emitting element 11B.

For example, as shown in FIGS. 5A and 5B, in the first direction Y, the first dummy pixel driving circuit 15A is not provided between the plurality of rows of first pixel driving circuits 14A extending in the second direction X. In this way, the size in the first direction Y of the area where the first pixel circuit group 14AZ composed of a plurality of rows of first pixel driving circuits 14A is located is smaller than the size in the first direction Y of the area where the plurality of first light-emitting elements 11A corresponding to the first pixel circuit group 14AZ are located, so that the first light-emitting elements 11A and the first pixel driving circuits 14A are arranged in a staggered manner. For example, as shown in FIGS. 2 and 3A, the edge BY2 of the first pixel driving circuit 14A that is parallel to the second direction X and closest to the bonding area 21 is closer to the second display area 102 than the edge BY1 (as shown in FIG. 3A) of the display area 10 that is parallel to the second direction X and closest to the bonding area 21. In this way, the plurality of leads ST1 are moved upwardly in a direction close to the second display area 102 along the first direction Y, and at least some of the plurality of leads ST1 are overlapped with the first display area 101, for example, all of the plurality of leads ST1 are overlapped with the first display area 101, so as to facilitate narrowing the lower bezel of the display substrate 1.

For example, in some embodiments, as shown in FIGS. 5A, 5B, 6A and 6B, the display substrate 1 further includes at least one column of second dummy pixel driving circuits 15B extending along the first direction Y. For example, one column of second dummy pixel driving circuits 15B is provided between four columns of pixel driving circuits. In this way, it can improve the uniformity of traces of the pixel driving circuits of the display substrate 1 so as to improve the display uniformity.

It should be noted that, in the embodiment of the present disclosure, the dummy pixel driving circuit and the pixel driving circuit have the same structure, but the dummy pixel driving circuit is not electrically connected with the light-emitting element.

FIG. 3B is a schematic diagram of yet another display substrate provided by at least one embodiment of the present disclosure.

For example, in some embodiments, as shown in FIG. 3B, the size Y12 of the second pixel driving circuit 14B in the first direction Y is greater than the size Y11 of the first pixel driving circuit 14A in the first direction Y. In such case, the pixel driving circuits of the display substrate 1 are partially compressed. For example, several rows of pixel driving circuits on the display substrate 1 close to the peripheral area 20 are compressed, so that the plurality of leads are moved upwardly towards the second display area 102 along the first direction Y, and at least some of the plurality of leads are overlapped with the first display area 101; in this way, the pixel driving circuits and the light-emitting elements are arranged in a staggered manner to narrow the lower bezel.

For example, in some embodiments, as shown in FIG. 3B, the size Y12 of the second pixel driving circuit 14B in the first direction Y is in a range of about 63-65 microns, and the size Y11 of the first pixel driving circuit 14A in the first direction Y is in a range of about 60-62 microns. For example, when the pixel driving circuits on the display substrate 1 are partially compressed, the size Y12 of the second pixel driving circuit 14B in the first direction Y is uncompressed. For example, in such case, the size of the lower bezel of the display substrate 1 needs to be compressed by an amount of M1. For example, the value of M1 can be set according to the design requirements, for example, 10-12 microns. For example, if the number of the rows of the pixel driving circuits of the display substrate that need to be compressed is X1, the amount of the size of each row of pixel driving circuits that needs to be compressed can be calculated by dividing M1 by X1. As a result, the value obtained by Y11-M1/X1 is the size Y11 of the pixel driving circuit in the first direction Y after compressed. It should be noted that, the value ranges of the size Y11 and the size Y12 as mentioned above are illustrated by way of example, and the size of the pixel driving circuit in the longitudinal direction after compressed can be flexibly determined based on the compressed amount of the display substrate and the number of the rows of the pixel driving circuits of the display substrate that need to be compressed, without particularly limited in the embodiments of the present disclosure.

For example, in some embodiments, as shown in FIGS. 5A, 5B, 6A and 6B, the plurality of connecting traces LS include a first connecting trace LS1 partially located in the first display area 101 and a second connecting trace LS2 located in the second display area; the second connecting trace LS2 electrically connects the second pixel driving circuit 14B and the second light-emitting element 11B; and the first connecting trace LS1 electrically connects the first pixel driving circuit 14A and the first light-emitting element 11A. The light emitted by the second light-emitting element 11B that is electrically connected with the second connection line LS2 and the light emitted by the first light-emitting element 11A that is electrically connected with the first connection line LS1 have the same color, for example, blue light. The line width of the second connecting trace LS2 is greater than that of the first connecting trace. In such case, because the first pixel driving circuit 14A and the first light-emitting element 11A are arranged in a staggered manner, the length of the first connecting trace LS1 at the side close to the contact pad BD1 is greater than the length of the second connecting trace LS2. With the increase of the length of the traces, the line width of the first connecting trace LS1 decreases due to restrict of the arrangement space.

By providing the second connecting trace LS2 with a larger line width, it can reduce the parasitic capacitance and voltage drop on the connecting trace and ensure the stability of the display performance of the display substrate 1 as far as possible.

It should be noted that, in the embodiment of the present disclosure, the line width refers to the width of the connecting trace in the direction perpendicular to its wiring direction.

For example, in some embodiments, as shown in FIGS. 2 and 3A, the peripheral area 20 further includes a bending area 23. The bending area 23 is located at a side of the first display area 101 away from the second display area 102. For example, the bending area 23 is located between the bonding area 21 and the first display area 101. The bending area 23 includes a plurality of signal lines 231 extending along the first direction Y and connected with a plurality of leads ST1 in one-to-one correspondence. The plurality of signal lines 231 are arranged at intervals in the second direction X. The plurality of signal lines 231 are also connected to the contact pads BD1 of the bonding area 21 in one-to-one correspondence so as to transmit electrical signals.

For example, in some embodiments, as shown in FIG. 3A, the plurality of leads ST1 include a plurality of first leads ST11 and a plurality of second leads ST12. The plurality of first leads ST11 are connected in one-to-one correspondence with the plurality of second leads ST12. The plurality of first leads ST11 are located in the first display area 101, and the plurality of second leads ST12 are located in the peripheral area 20 and are connected in one-to-one correspondence with the plurality of signal lines 231. The first lead ST11 is closer to the second display area 102 than the second lead ST12. As shown in FIG. 2, the plurality of data lines DAT have a first average line spacing PD1 in the second direction X. As shown in FIG. 3A, the plurality of signal lines 231 have a second average line spacing PD7 in the second direction X, and the plurality of first leads ST11 have a third average line spacing PD5 in the second direction X. The third average line spacing PD5 is between the first average line spacing PD1 and the second average line spacing PD7. At this time, the third average line spacing PD5 of the plurality of leads ST1 is gradually narrowed in the first display area 101, the plurality of leads ST1 are moved upwardly towards the second display area 102 along the first direction Y, and at least some of the plurality of leads ST1 are overlapped with the first display area 101, for example, the plurality of leads ST1 are located in the first display area 101, so as to reduce the lower bezel of the display substrate.

For example, in some embodiments, as shown in FIG. 3A, the third average line spacing PD5 between the first leads ST11 decreases in the first direction Y from a side close to the plurality of data lines DAT to another side away from the plurality of data lines DAT. That is, the third average line spacing PD5 of the plurality of first leads ST11 is gradually narrowed from top to bottom, so that the plurality of first leads ST11 form a gradually narrowed fan shape.

It should be noted that, in the embodiment of the present disclosure, the average line spacing refers to an average value of the spacing distances between the plurality of traces along the second direction X.

For example, in some embodiments, as shown in FIGS. 2 and 3A, the display area 10 includes a light-emitting layer LC1 and a pixel circuit layer DR1 which are stacked, the light-emitting layer LC1 is located at the side of the pixel circuit layer DR1 away from the base substrate 100, and the display area 10 also includes a plurality of pixel unit groups arranged in rows and columns in an array, each of the plurality of pixel unit groups includes a plurality of sub-pixels arranged in at least one row, and each of the plurality of sub-pixels includes a pixel driving circuit (including a first pixel driving circuit 14A and a second pixel driving circuit 14B) and a light-emitting element (including a first light-emitting element 11A and a second light-emitting element 11B). The pixel driving circuit is configured to drive the light-emitting element to emit light. The light-emitting layer LC1 has a first edge BY1 which is opposite to the bending region 23 and parallel to the second direction X. The plurality of leads ST1 have a fifth average line spacing PD3 at a position overlapped with the first edge BY1 of the light-emitting layer LC1. The first average line spacing PD1 is larger than the second average line spacing PD7, and the fifth average line spacing PD3 is between the first average line spacing PD1 and the second line spacing PD7. At this time, at least some of the plurality of leads ST1 are located in the first display area 101, thereby reducing the lower bezel of the display substrate 1.

For example, in some embodiments, as shown in FIGS. 2 and 3A, the pixel circuit layer DR1 has a second edge BY2 opposite to the bending region 23 and parallel to the second direction X, and the first edge BY1 of the light-emitting layer LC1 (shown in FIG. 3A) is closer to the bending region 23 than the second edge BY2 of the pixel circuit layer DR1.

For example, in some embodiments, as shown in FIG. 3A, a plurality of signal lines 231 or a plurality of leads ST1 of the bending region 23 intersects with the first edge BY1 in a direction perpendicular to the base substrate 100. For example, the plurality of leads ST1 are overlapped with the first edge BY1 of the light-emitting layer LC1, or the plurality of signal lines 231 are overlapped with the first edge BY1 of the light-emitting layer LC1, so that the positions of the plurality of leads ST1 are moved upwardly relative to the light-emitting layer LC1, and at least some of the plurality of leads ST1 are located in the orthographic projection of the light-emitting layer LC1 on the substrate surface S of the base substrate 100, thereby reducing the lower bezel of the display substrate 1.

For example, in some embodiments, as shown in FIG. 2 and FIG. 3A, when connection points (shown by solid dots in the figure) of the plurality of leads ST1 and the plurality of data lines DAT are located in the second display area 102, in the case where the plurality of leads ST1 intersect with the second edge BY2 in the direction perpendicular to the base substrate 100, the plurality of leads ST1 have a sixth average line spacing PD4 (shown in FIG. 2) at the position of the second edge BY2, and the sixth average line spacing PD4 is between the first average line spacing PD1 and the third average line spacing PD3. At this time, portions of the plurality of leads ST1 are overlapped with portions of the light-emitting layer LC1 located in the first display area 101. For example, in some embodiments, as shown in FIG. 5B, the light-emitting elements (including the first light-emitting elements 11A and the second light-emitting elements 11B) of sub-pixels of a plurality of pixel unit groups arranged in rows and columns in an array have a first average column period length PZ1 in the first direction Y. As shown in FIG. 3A, the pixel driving circuits (including the first pixel driving circuits 14A and the second pixel driving circuits 14B) of sub-pixels of a plurality of pixel unit groups arranged in rows and columns in an array have a second average column period length Y12 in the first direction Y; the second average column period length Y12 is smaller than the first average column period length PZ1. Therefore, at the side of the display area close to the bending area 23, the light-emitting elements and the pixel driving circuits are arranged in a staggered manner to reduce the size of the lower frame.

For example, as shown in FIGS. 6A and 6B, in the case where the first dummy pixel driving circuit 15A is not provided, the pixel driving circuits of the sub-pixels of a plurality of pixel unit groups arranged in rows and columns in an array have a column period length PZ2 in the second display area 102 of the display area 10 in the first direction Y. For example, the column period length PZ2 is equal to the first average column period length PZ1 (shown in FIG. 6B). The first average column period length PZ1 is the size, in the first direction Y, of an area where the plurality of light-emitting elements connected to the second pixel circuit group 14BZ are located. At this time, the pixel driving circuits of the display substrate 1 are compressed, as a whole, in the first direction Y.

For example, as shown in FIG. 5A, in the case where the pixel driving circuits of the display substrate 1 are compressed as a whole in the first direction Y, one row of first pixel driving circuit groups 14AZ of the display area 10 closest to the bending area 23 has a column period length PZ3. For example, the column period length PZ3 is smaller than the first average column period length PZ1. At this time, the size, in the first direction Y, of the plurality of rows of first pixel driving circuits 14A of the display area 10 that are close to the bending area 23 is compressed, so that the plurality of leads are moved upwardly in a direction close to the second display area along the first direction, and at least some of the plurality of leads are overlapped with the first display area to reduce the lower frame of the display substrate 1.

For example, in some embodiments, as shown in FIG. 3A, the spacing between one row of first pixel driving circuits 14A closest to the bending region 23 and the first edge BY1 of the light-emitting layer LC1 is JD3 (along the first direction Y). For example, the spacing JD3 may also indicate the size of a portion of the light-emitting layer LC1 that extends beyond the first pixel driving circuit 14A in the first direction Y. For example, the spacing JD3 may be greater than or equal to the size PZ3 of two rows of second pixel driving circuits 14A in the first direction Y. For example, the size of the spacing JD3 can be designed according to the size by which the lower frame needs to be narrowed, but the embodiments of the present disclosure are not limited thereto.

Figure 7:
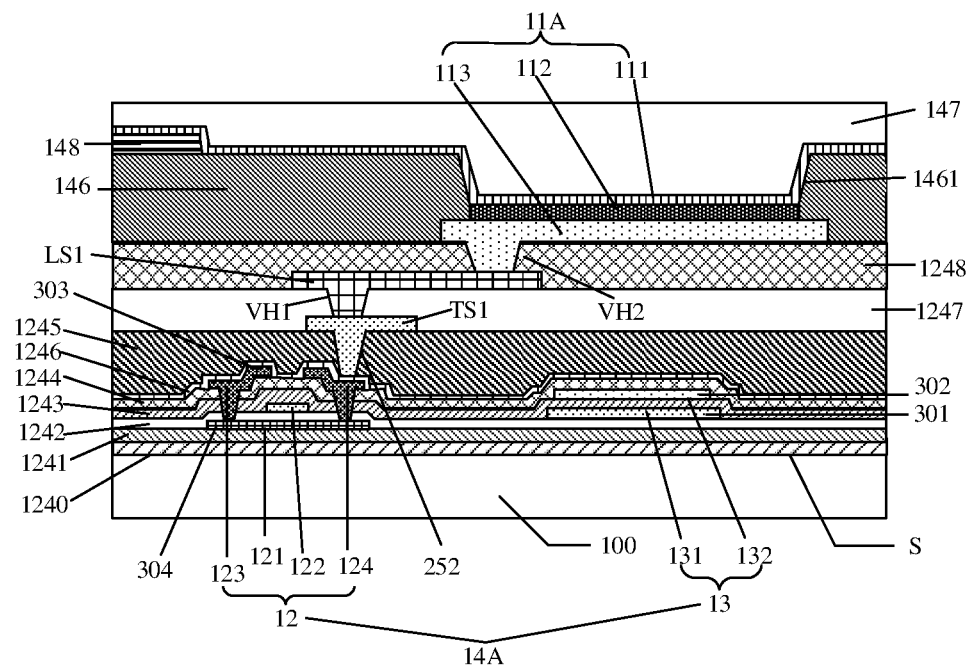
FIG. 7 is a schematic cross-sectional view of a display substrate provided by at least one embodiment of the present disclosure.

FIG. 7 is a schematic cross-sectional view of a display substrate provided by at least one embodiment of the present disclosure. For example, FIG. 7 is a schematic cross-sectional view of one sub-pixel of the first display area 10, and the cross-sectional views of other sub-pixels can refer to FIG. 7, which will not be repeated here.

For example, in some embodiments, as shown in FIG. 7, the display substrate 1 further includes a first metal layer 301, a second metal layer 302 and a third metal layer 303. The first metal layer 301 is located on the base substrate 100, the second metal layer 302 is located at a side of the first metal layer 301 away from the base substrate 100, and the third metal layer 303 is located at a side of the second metal layer 302 away from the base substrate 100. As shown in FIG. 4, a plurality of leads ST1 is arranged in the same layer as the first metal layer 301 or the second metal layer 302 to simplify the manufacturing process.

For example, in some embodiments, as shown in FIG. 4 and FIG. 7, some of the plurality of leads ST1 (for example, the lead ST21) are arranged in the same layer as the first metal layer 301, and some other of the plurality of leads ST1

(for example, the lead ST22) are arranged in the same layer as the second metal layer 302; and the leads ST1 located in different layers are alternately arranged. For example, the leads ST21 and ST22 are located in different layers and are alternately arranged to reduce the wiring space and the crosstalk between signals.

It should be noted that, in the embodiment of the present disclosure, "arranged in the same layer" includes the case where two functional layers or structural layers are in the same layer of the display substrate in terms of hierarchical structure and are formed of the same material; that is, in the manufacturing process, the two functional layers or structural layers can be formed from the same material layer, and the required patterns and structures can be formed by the same patterning process. A single patterning process includes, for example, steps of forming a photoresist, exposing the photoresist, developing the photoresist, etching the photoresist and others.

For example, the materials of the first metal layer 301, the second metal layer 302 and the third metal layer 303 may include metal materials or alloy materials, such as a metallic single-layered or multi-layered structure formed of molybdenum, aluminum, titanium, etc. For example, the multi-layered structure is a multi-metal lamination (such as a three-layered metal lamination of titanium, aluminum and titanium (Ti/Al/Ti)). For example, the materials of the first metal layer 301, the second metal layer 302 and the third metal layer 303 may be the same or different, and the embodiments of the present disclosure are not limited thereto.

For example, in some embodiments, as shown in FIG. 7, the display substrate 1 further includes a first insulating layer 1245 (e.g., the first planarization layer), a second insulating layer 1247 (e.g., the second planarization layer) and a third insulating layer 1248 (e.g., the third planarization layer) which are located at a side of the plurality of first pixel driving circuits 14A away from the base substrate 100. For example, the second insulating layer 1247 is located between the first insulating layer 1245 and the third insulating layer 1248. The connecting trace LS1 is arranged at a side of the second insulating layer 1247 away from the base substrate 100.

As shown in FIG. 5A, FIG. 5B and FIG. 7, one end of the connecting trace LS1 is electrically connected with the corresponding first light-emitting element 11A through a via hole VH2 in the third insulating layer 1248.

For example, the materials of the first insulating layer 1245, the second insulating layer 1247 and the third insulating layer 1248 include inorganic insulating materials such as silicon oxide, silicon nitride, and silicon oxynitride, and may also include organic insulating materials such as polyimide, polyamide, acrylic resin, benzocyclobutene, or phenolic resin, without limited by the embodiments of the present disclosure.

For example, as shown in FIG. 7, the display substrate 1 further includes a transition electrode TS1 connected to a first pixel driving circuit 14A or a second pixel driving circuit 14B (not shown in FIG. 7). The transition electrode TS1 is located at a side of the first insulating layer 1245 away from the base substrate 100. The transition electrode TS1 is electrically connected to a drain electrode 124 of a first transistor 12 in the corresponding first pixel driving circuit 14A through a via hole 252 in the first insulating layer 1245, and is also connected to a corresponding connecting trace LS1 through a via hole VH1 in the second insulating layer 1247.

For example, as shown in FIG. 7, the display substrate further includes a first gate insulating layer 1242, a second gate insulating layer 1243, an interlayer insulating layer 1244 and an active layer 121. The interlayer insulating layer 1244 is arranged at a side of the third metal layer 303 close to the base substrate 100. The second gate insulating layer 1243 is arranged at a side of the interlayer insulating layer 1244 close to the base substrate 100. The first gate insulating layer 1242 is arranged at a side of the second gate insulating layer 1243 close to the base substrate 100. The second metal layer 302 is located between the interlayer insulating layer 1244 and the second gate insulating layer 1243. The first metal layer 301 is located between the second gate insulating layer 1243 and the first gate insulating layer 1242. The active layer 121 is located at a side of the first gate insulating layer 1242 close to the base substrate 100.

For example, the material of one or more of the first gate insulating layer 1242, the second gate insulating layer 1243 and the interlayer insulating layer 1244 may include an insulating material such as silicon oxide, silicon nitride and silicon oxynitride. The materials of the first gate insulating layer 1242, the second gate insulating layer 1243 and the interlayer insulating layer 1244 may be the same or different.

For example, the material of the active layer 121 may include polysilicon or oxide semiconductor (for example, indium gallium zinc oxide (IGZO)).

For example, as shown in FIG. 7, the display substrate 1 may further include a buffer layer 1241 and a barrier layer 1240. The buffer layer 1241 is located at a side of the active layer 121 close to the base substrate 100, and the barrier layer 1240 is located at a side of the buffer layer 1241 close to the base substrate 100. The buffer layer 1241 serves as a transition layer, which can not only prevent harmful substances in the base substrate from invading into the display substrate, but also increase the adhesion of the film layers of the display substrate 1 onto the base substrate 100. The barrier layer 1240 can provide a flat surface for forming the first pixel driving circuit 14A, and can prevent impurities possibly existed in the base substrate 100 from diffusing into the first pixel driving circuit 14A and adversely affecting the performance of the display substrate 1.

For example, as shown in FIG. 7, the first pixel driving circuit 14A or the second pixel driving circuit 14B further includes a first transistor 12 and a storage capacitor 13. The first transistor 12 includes a transistor directly electrically connected to the first light-emitting element 11A, such as a switching transistor (e.g., a light-emitting control transistor) or a driving transistor. The first transistor 12 includes a gate electrode 122, a source electrode 123, a drain electrode 124 and an active layer 121; and the storage capacitor 13 includes a first electrode plate 131 and a second electrode plate 132. The gate electrode 122 is located in the first metal layer 301, and the source-drain electrodes (source electrode 123 and drain electrode 124) are located in the third metal layer 303. For example, the first electrode plate 131 is located in the first metal layer 301 and the second electrode plate 132 is located in the second metal layer 302. The gate electrode 122 and the first electrode plate 131 are arranged in the same layer. The first electrode plate 131 and the second electrode plate 132 are spaced apart by the second insulating layer 1243, so as to realize a capacitor function.

For example, in other embodiments, the first electrode plate 131 may be located in the second metal layer 302, and the second electrode plate 132 may be located in the third metal layer 303. At this time, the first electrode plate 131 and the second electrode plate 132 are spaced apart by the interlayer insulating layer 1244. The embodiments of the present disclosure are not limited to the specific arrangement of the storage capacitor 13.

For example, as shown in FIG. 7, the display substrate 1 further includes a passivation layer 1246, which is located at a side of the first insulating layer 1245 close to the base substrate 100. At this time, the via hole 252 also penetrates through the passivation layer 1246. The passivation layer 1246 can protect the source electrode 123 and the drain electrode 124 of the first pixel driving circuit 14A from water vapor corrosion. The drain electrode 124 of the first transistor 12 in the first pixel driving circuit 14A and the transition electrode TS1 are connected through the via hole 252.

For example, the material of the passivation layer 1246 may include an organic insulating material or an inorganic insulating material, such as silicon nitride material. The silicon nitride material has high dielectric constant and good hydrophobic function, so that the first pixel driving circuit 14A can be well protected against water vapor corrosion.

For example, as shown in FIG. 7, the display substrate 1 further includes a pixel defining layer 146. The first light-emitting element 11A is arranged at a side of the second insulating layer 1245 away from the base substrate 100. The first light-emitting element 11A includes a first electrode 113 (e.g., anode), a light-emitting layer 112 and a second electrode 111 (e.g., cathode). The first electrode 113 is located at a side of the second insulating layer 1245 away from the base substrate 100, and is connected to the connecting trace LS1 through the via hole VH2. The second electrode 111 is located at a side of the pixel defining layer 146 away from the base substrate 100. The pixel defining layer 146 is located at a side of the first electrode 113 away from the base substrate 100 and includes a first pixel opening 1461. The first pixel opening 1461 is arranged to be corresponding to the first light-emitting element 11A. The light-emitting layer 112 is located in the first pixel opening 1461, and is located between the first electrode 113 and the second electrode 111. A part of the light-emitting layer 112 directly sandwiched between the first electrode 113 and the second electrode 111 will emit light after being energized, so that an area occupied by this part corresponds to the light-emitting area of the first light-emitting element 11A.

For example, the first pixel driving circuit 14A generates a light-emitting driving current under the control of the data signal provided by the data line DAT, the gate scanning signal and the light-emitting control signal provided by the shift register, the power signal and the like, and the light-emitting driving current enables the first light-emitting element 11A to emit red light, green light, blue light, or white light, etc.

For example, the material of the pixel defining layer 146 may include an organic insulating material such as polyimide, polyamide, acrylic resin, benzocyclobutene or phenolic resin, or an inorganic insulating material such as silicon oxide and silicon nitride, without limited by the embodiments of the present disclosure.

For example, the material of the first electrode 113 may include at least one transparent conductive oxide material, including indium tin oxide (ITO), indium zinc oxide (IZO), zinc oxide (ZnO) and the like. Furthermore, the first electrode 113 may include a metal with high reflectivity as a reflective layer, such as silver (Ag).

For example, the light-emitting layer 112 for OLED can include small molecular organic materials or polymer molecular organic materials, can be fluorescent light-emitting materials or phosphorescent light-emitting materials, and can emit red light, green light, blue light or white light; furthermore, the light-emitting layer may further include functional layers such as electron injection layer, electron transport layer, hole injection layer and hole transport layer as required.

For example, the light-emitting layer 112 for QLED may include quantum dot materials, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots is 2-20 nm.

For example, the second electrode 111 may include various conductive materials. For example, the second electrode 111 may include metal materials such as lithium (Li), aluminum (Al), magnesium (Mg), silver (Ag), etc.

For example, as shown in FIG. 7, the display substrate 1 further includes a spacer 148 located at a side of the pixel defining layer 146 away from the base substrate 100, that is, the spacer 148 is located between the pixel defining layer 146 and the second electrode 111. For example, the material of the spacer 148 may include a transparent insulating material.

For example, as shown in FIG. 7, the display substrate 1 further includes an encapsulation layer 147. The encapsulation layer 147 is located at a side of the second electrode 111 away from the base substrate 100. The encapsulation layer 147 seals the first light-emitting element 11A, so that the degradation of the first light-emitting element 11A caused by moisture and/or oxygen contained in the environment can be reduced or prevented. The encapsulation layer 147 may have a single-layered structure or a composite layer structure including a stacked structure of inorganic layers and organic layers. The encapsulation layer 147 includes at least one encapsulation sublayer. For example, the encapsulation layer 147 may include a first inorganic encapsulation layer, a first organic encapsulation layer and a second inorganic encapsulation layer which are sequentially arranged.

For example, the material of the encapsulation layer 147 may include insulating materials such as silicon nitride, silicon oxide, silicon oxynitride and polymer resin. Inorganic materials such as silicon nitride, silicon oxide and silicon oxynitride have high density, which can prevent from an invasion of water and oxygen. The material of the organic encapsulation layer can be a polymer material containing a desiccant or a polymer material that can block water vapor such as a polymer resin, so as to planarize the surface of the display substrate and relieve the stress of the first inorganic encapsulation layer and the second inorganic encapsulation layer; and the material of the organic encapsulation layer can also include a water-absorbing material such as a desiccant to absorb water, oxygen and other invading substances.

Figure 8:
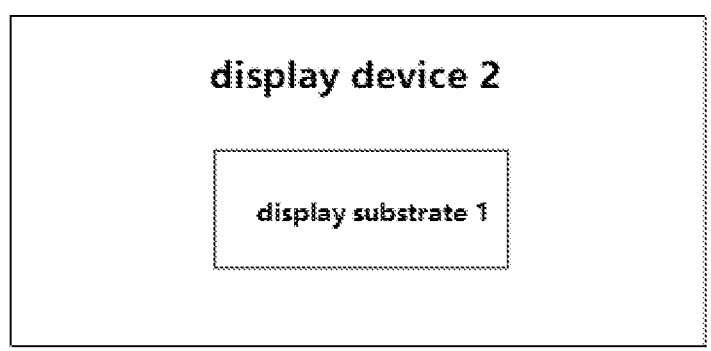
FIG. 8 is a schematic diagram of a display device provided by at least one embodiment of the present disclosure.

FIG. 8 is a schematic diagram of a display device provided by at least one embodiment of the present disclosure.

At least one embodiment of the present disclosure also provides a display device. FIG. 8 is a schematic diagram of a display device provided by an embodiment of the present disclosure. As shown in FIG. 8, the display device 2 includes the display substrate 1 provided in any embodiment of the present disclosure and signal input elements. For example, the display substrate 1 shown in FIG. 3A or 3B is used as the display substrate 1.

It should be noted that the display device 2 can be a wearable device. For example, the display device 2 can also be any product or component with display function such as OLED panel, OLED TV, QLED panel, QLED TV, mobile phone, tablet computer, notebook computer, digital photo frame, navigator, etc. The display device 2 may also include other components, such as a data driving circuit, a timing controller, etc., which is not limited by the embodiments of the present disclosure.

It should be noted that, for the sake of clarity and conciseness, the embodiments of the present disclosure do not show all the constituent units of the display device. In order to realize the basic functions of the display device, a person skilled in the art can provide and design other structures not shown according to specific needs, which are not limited by the embodiments of the present disclosure.

For the technical effects of the display device 2 provided in the above embodiments, reference can be made to the technical effects of the display substrate 1 provided in the embodiments of the present disclosure, which will not be repeated here.

The following points need to be explained:
(1) The drawings of the embodiments of the present disclosure only refer to the structures related to the disclosed embodiments, and other structures can refer to the general design.
(2) Without conflict, the embodiments of the present disclosure and the features in the embodiments can be combined with each other to obtain new embodiment(s).

The above are only optional embodiments of the present disclosure without limiting the present disclosure. Any modifications, equivalent substitutions, improvements or the like within the spirit and principle of the present disclosure should be fallen within the protection scope of the present disclosure. Therefore, the protection scope of the present disclosure should be delimited by the protection scope of the claims.

What is claimed is:

1. A display substrate, comprising:
   a base substrate, comprising a display area and a peripheral area located at least at one side of the display area, the display area comprising a first display area and a second display area, and the first display area being located between the second display area and the peripheral area in a first direction;
   at least one group of contact pads located in the peripheral area;
   a plurality of first light-emitting elements located in the first display area;
   a plurality of first pixel driving circuits located in the second display area;
   a plurality of connecting traces, one end of at least one connecting trace of the plurality of connecting traces being electrically connected with at least one first light-emitting element of the plurality of first light-emitting elements, and the other end of the at least one connecting trace being electrically connected with the first pixel driving circuit;
   a plurality of data lines located in the second display area and configured to provide data signals to the plurality of first pixel driving circuits; and
   a plurality of leads located in the first display area and in the peripheral area, the plurality of leads connecting the plurality of data lines and the at least one group of contact pads;
   wherein orthographic projections of the plurality of first light-emitting elements on a substrate surface of the base substrate are at least partly overlapped with orthographic projections of the plurality of leads on the substrate surface of the base substrate.

2. The display substrate according to claim 1, wherein the orthographic projections of at least some first light-emitting elements of the plurality of first light-emitting elements on the substrate surface of the base substrate have no overlap with orthographic projections of the plurality of first pixel driving circuits and the plurality of data lines on the substrate surface of the base substrate.

3. The display substrate according to claim 1, further comprising a plurality of second pixel driving circuits and a plurality of second light-emitting elements, wherein
   the plurality of second pixel driving circuits and the plurality of second light-emitting elements are located in the second display area, and the plurality of second pixel driving circuits are configured to drive the plurality of second light-emitting elements to emit light,
   the plurality of second pixel driving circuits are electrically connected with the plurality of data lines, and the plurality of data lines are configured to provide data signals to the plurality of second pixel driving circuits, and
   orthographic projections of the plurality of second light-emitting elements on the substrate surface of the base substrate are at least partly overlapped with orthographic projections of the plurality of second pixel driving circuits on the substrate surface of the base substrate.

4. The display substrate according to claim 3, wherein the plurality of second pixel driving circuits comprise a plurality of second pixel circuit groups arranged along the first direction and extending along a second direction, the first direction intersects with the second direction, and each of the plurality of second pixel circuit groups comprises a plurality of rows of second pixel driving circuits extending along the second direction;
   the plurality of first pixel driving circuits comprise a plurality of first pixel circuit groups arranged along the first direction and extending along the second direction, and each of the plurality of first pixel circuit groups comprises a plurality of rows of first pixel driving circuits extending along the second direction; and
   the plurality of rows of second pixel driving circuits are located at a side of the plurality of rows of first pixel driving circuits away from the first display area.

5. The display substrate according to claim 4, further comprising at least one row of first dummy pixel driving circuits extending along the second direction,
   in the first direction, the at least one row of first dummy pixel driving circuits are distributed at intervals between the at least one row of second pixel driving circuits extending along the second direction.

6. The display substrate according to claim 5, wherein in the first direction, the first dummy pixel driving circuit is not provided between a plurality of rows of first pixel driving circuits extending in the second direction.

7. The display substrate according to claim 5, wherein in the first direction, two adjacent rows of first dummy pixel driving circuits extending in the second direction are spaced apart by at least one second pixel circuit group.

8. The display substrate according to claim 4, wherein a size of the second pixel driving circuit in the first direction is larger than that of the first pixel driving circuit in the first direction.

9. The display substrate according to claim 8, wherein the size of the second pixel driving circuit in the first direction is in the range from 63 microns to 65 microns, and the size of the first pixel driving circuit in the first direction is in the range from 60 microns to 62 microns.

10. The display substrate according to claim 4, wherein a size of the first pixel driving circuit and a size of the second pixel driving circuit are equal in the first direction.

11. The display substrate according to claim 10, wherein the size of the first pixel driving circuit and the size of the second pixel driving circuit are equal in the first direction, and have a value in the range from 63.8 microns to 63.9 microns.

12. The display substrate according to claim 4, wherein the plurality of connecting traces comprise a first connecting trace partially located in the first display area and a second connecting trace located in the second display area, wherein the second connecting trace is electrically connected with a corresponding second light-emitting element, the first connecting trace is electrically connected with a corresponding first light-emitting element, and the corresponding second light-emitting element electrically connected with the second connecting trace and the corresponding first light-emitting element electrically connected with the first connecting trace emit light with the same color; and a line width of the second connecting trace is larger than that of the first connecting trace.

13. The display substrate according to claim 3, further comprising a first metal layer, a second metal layer and a third metal layer, wherein the first metal layer is located on the base substrate, the second metal layer is located at a side of the first metal layer away from the base substrate, and the third metal layer is located at a side of the second metal layer away from the base substrate;

the plurality of leads are arranged in the same layer as the first metal layer or the second metal layer; or some leads of the plurality of leads are arranged in the same layer as the first metal layer, and the other leads of the plurality of leads are arranged in the same layer as the second metal layer; and the some leads and the other leads are alternately arranged.

14. The display substrate according to claim 1, wherein the peripheral area further comprises a bending area which is located at a side of the first display area away from the second display area, and the bending area comprises a plurality of signal lines, the plurality of signal lines extend along the first direction and are connected in one-to-one correspondence with the plurality of leads;

wherein the first direction intersects with the second direction.

15. The display substrate according to claim 14, wherein the plurality of leads comprise a plurality of first leads and a plurality of second leads, the plurality of first leads are connected in one-to-one correspondence with the plurality of second leads, the plurality of first leads are located in the first display area, and the plurality of second leads are located in the peripheral area and are connected in one-to-one correspondence with the plurality of signal lines.

16. The display substrate according to claim 15, wherein the plurality of data lines have a first average line spacing in the second direction, the plurality of signal lines have a second average line spacing in the second direction, and the plurality of first leads have a third average line spacing in the second direction;

wherein the third average line spacing is between the first average line spacing and the second average line spacing.

17. The display substrate according to claim 15, wherein the third average line spacing of the plurality of first leads is decreased, in the first direction, from a side close to the plurality of data lines to another side away from the plurality of data lines.

18. A display device, comprising the display substrate according to claim 1.

19. The display device according to claim 18, wherein the orthographic projections of at least some first light-emitting elements of the plurality of first light-emitting elements on the substrate surface of the base substrate have no overlap with orthographic projections of the plurality of first pixel driving circuits and the plurality of data lines on the substrate surface of the base substrate.

20. The display device according to claim 18, wherein the display substrate further comprises a plurality of second pixel driving circuits and a plurality of second light-emitting elements, wherein the plurality of second pixel driving circuits and the plurality of second light-emitting elements are located in the second display area, and the plurality of second pixel driving circuits are configured to drive the plurality of second light-emitting elements to emit light, the plurality of second pixel driving circuits are electrically connected with the plurality of data lines, and the plurality of data lines are configured to provide data signals to the plurality of second pixel driving circuits, and orthographic projections of the plurality of second light-emitting elements on the substrate surface of the base substrate are at least partly overlapped with orthographic projections of the plurality of second pixel driving circuits on the substrate surface of the base substrate.

* * * * *